United States Patent [19]

Tomita et al.

[11] Patent Number: 5,634,980
[45] Date of Patent: Jun. 3, 1997

[54] METHOD FOR WASHING SUBSTRATES

[75] Inventors: Manabu Tomita; Hiroichi Kawahira; Yoshiaki Honda, all of Kanagawa, Japan

[73] Assignee: Sony Corporation, Tokyo, Japan

[21] Appl. No.: 544,916

[22] Filed: Oct. 18, 1995

Related U.S. Application Data

[63] Continuation of Ser. No. 219,536, Mar. 29, 1994, abandoned.

[30] Foreign Application Priority Data

Mar. 31, 1993 [JP] Japan .................. 5-094985

[51] Int. Cl.$^6$ ............................ B08B 3/08
[52] U.S. Cl. .................. 134/3; 134/18; 134/33
[58] Field of Search .................. 134/2, 3, 18, 26, 134/33

[56] References Cited

U.S. PATENT DOCUMENTS

| | | | |
|---|---|---|---|
| 3,900,337 | 8/1975 | Beck et al. | 134/3 |
| 4,027,686 | 6/1977 | Shortes | 134/33 |
| 4,651,440 | 3/1987 | Karl | 34/58 |
| 4,738,272 | 4/1988 | McConnell | 134/59 |
| 4,903,717 | 2/1990 | Sumnitsch | 134/99 |
| 4,917,123 | 4/1990 | McConnell et al. | 134/95 |
| 5,001,084 | 3/1991 | Kawai et al. | 134/33 |
| 5,100,476 | 3/1992 | Mase et al. | 134/1 |
| 5,158,100 | 10/1992 | Tanaka et al. | 134/105 |
| 5,185,056 | 2/1993 | Fuentes et al. | 134/33 |
| 5,279,704 | 1/1994 | Saito | 134/33 |
| 5,294,570 | 3/1994 | Fleming, Jr. et al. | 134/3 X |
| 5,336,425 | 8/1994 | Aoki et al. | 134/3 |

FOREIGN PATENT DOCUMENTS

| | | |
|---|---|---|
| 0316296 | 5/1989 | European Pat. Off. . |
| 63-15710 | 1/1988 | Japan . |

Primary Examiner—Jill Warden
Attorney, Agent, or Firm—Hill, Steadman & Simpson

[57] ABSTRACT

A method for washing a photomask substrate or a semiconductor wafer. The mixing heat generated on mixing $H_2SO_4$ and $H_2O_2$ is effectively utilized for promoting the reaction. $H_2SO_4$ and $H_2O_2$ are discharged from separate nozzles and mixed at a mixing point directly below and proximate to the nozzles to give a $H_2SO_4$—$H_2O_2$ liquid mixture. The liquid mixture is caused to descend onto near the center of the photomask kept in rotation so that the liquid mixture is spread over the substrate surface under a centrifugal force. The $H_2SO_4$—$H_2O_2$ flow ratios, the height of the mixing point and the number of revolutions of the substrate are controlled for providing the uniform temperature distribution of the liquid mixture on the substrate surface and for achieving uniform washing. In this manner, the chloromethylstyrene resist materials, which are employed in electron lithography, and which are only hardly soluble, may be exfoliated by a wet exfoliation technique.

5 Claims, 5 Drawing Sheets

METHOD FOR WASHING SUBSTRATES

This application is a continuation of application Ser. No. 08/219,536, filed Mar. 29, 1994 and now abandoned.

BACKGROUND OF THE INVENTION

1. Field of the Invention

This invention relates to a method and apparatus for washing a photomask substrate or a semiconductor wafer employed in the manufacture process of semiconductor devices. More particularly, it relates to a substrate washing method and apparatus whereby it is possible to exfoliate a resist pattern remaining on the substrate.

2. Description of the Related Art

With an increasingly refined design rule for circuit patterns and device arraying patterns on a semiconductor device, contamination by various particles, metal impurities or organic substances generated on or affixed to a photomask substrate or a semiconductor wafer employed in the production process of semiconductor devices has come to affect the product yield or reliability significantly. Thus it becomes necessary to wash off contaminants occasionally affixed to the photomask substrate or the semiconductor wafer during the manufacture process of the semiconductor devices.

As the method for washing the photomask substrate or the semiconductor wafer, dry washing with plasma processing or irradiation with ultra-violet (UV) rays, or a wet washing using a washing solution, have been proposed.

Dry washing is a technique proposed in keeping with the general tendency of the semiconductor process towards a dry process. It has such assets that it is superior in washing uniformity and suffers from re-deposition of contaminants on the substrates to a lesser extent, while it can be integrated to other dry processes, and a drying step may be eliminated. However, it is not suited to removal of contaminants and is unable to remove particles, while it is liable to damage the substrate and produce secondary contamination. Consequently, if dry washing is applied, it becomes necessary to perform subsequent wet washing or rinsing with pure water.

On the other hand, wet washing may be carried out using an inexpensive device, while being superior in throughput and capable of removing plural contaminants simultaneously. Besides, it is possible with the wet washing to perform batch processing and simultaneous washing of the front and reverse sides. Above all, a photomask substrate for light exposure for reduced size projection in which a circuit pattern or device arraying pattern applied is about five times as large as the wafer is usually washed by wet washing.

The simplest washing method consists of immersing the substrate in a washing tank for a pre-set time and mechanically washing the substrate taken out from the tank with a brush. It is however not possible with such method to prevent the foreign matter mixed into the washing tank or affixed to the brush from being deposited on the substrate. Moreover, the longer the substrate is left after it is washed, the greater is the amount of the foreign matter deposited on the substrate.

As a technique for inhibiting the re-deposition to a certain extent, there is known a technique known as spin washing. With this technique, since the washing solution is sprayed onto the substrate held on a rotary block, the washing liquid is perpetually scattered under the centrifugal force so that re-deposition is hardly incurred. Also, rinsing with pure water may be achieved by spraying pure water in the course of the treatment in substitution for the washing liquid, whereas drying may also be achieved by continuing the rotation of the substrate while the supply of pure water is stopped. The washing apparatus described in, for example, the JP Patent Kokai Publication No. 63-15710 (1988) is directed to the spin washing. However, the washing apparatus is bulky in size since it is provided with a mechanism for optical washing by irradiation of UV rays after the termination of the spin washing.

The above-described wet washing may be directly applied to the exfoliation of the resist pattern (by decomposition and removal) if the washing liquid is replaced by the resist exfoliation liquid. However, in the preparation of semiconductor apparatus, there is recently employed a resist material which can hardly be exfoliated with the combination of the conventional resist exfoliation liquid and the washing apparatus, such as chloromethylstyrene (CMS) resist material. For wet exfoliation of the resist material, which is employed for far-UV lithography, electron lithography or X-ray lithography, it is necessary to use a strongly oxidative resist exfoliation liquid, such as a mixed solution of sulfuric acid ($H_2SO_4$) and aqueous hydrogen peroxide ($H_2O_2$), known as aqueous persulfuric acid. The $H_2SO_4$—$H_2O_2$ liquid mixture, abbreviated to SPM in the field of wet washing, is a washing liquid employed for removing organic contaminants. However, even with the above-mentioned liquid mixture, the CMS resist material cannot be exfoliated stably, such that recourse cannot but be had to $O_2$ plasma washing which is inferior in costs and throughput.

SUMMARY OF THE INVENTION

It is an object of the present invention to provide a method and apparatus whereby not only the washing effects by wet washing may be enhanced, but also may be exfoliated the hardly soluble resist pattern.

It is in general a well-known basic item in chemistry that the rate of dissolution of a solid in a solution be raised under heating conditions. As a matter of fact, in a wet washing of the type in which the substrate is immersed in a washing tank, it is a frequent practice to raise the rate of washing by heating the washing liquid in the washing tank. Although heating is basically possible in spin washing by taking measures such as enclosing a heater in a rotary base supporting the substrate, it may be presumed that desirable results cannot necessarily be achieved when the efficiency of heat conduction to the washing solution or the structure of the apparatus is taken into consideration.

The present inventor has set an eye on the fact that the rate of washing may be raised by heating the washing solution in the washing tank in the wet washing in which the substrate is immersed in the washing tank, and has arrived at the present invention in which the washing rate or the resist exfoliation efficiency may be improved by utilizing the mixing heat generated on mixing certain types of liquid medicaments.

The present invention provides a method for washing a substrate by bringing a liquid washing mixture composed of plural types of liquid medicaments into contact with the substrate, comprising preparing the liquid washing mixture by mixing the liquid medicaments, discharged from separate supply ports, before the liquid medicaments reach the surface of the substrate, and raising the temperature of the liquid washing mixture by the mixing heat evolved during mixing.

Also, the method of the present invention comprises controlling the flow ratios of the plural types of the medicaments for optimizing the temperature distribution of the liquid washing mixture on the substrate.

In addition, the method of the present invention controls the distance from the point of mixing of the plural types of the medicaments to the substrate surface for optimizing the temperature distribution of the liquid washing mixture on the substrate.

Furthermore, the method of the present invention repeats a washing cycle consisting of washing with the liquid washing mixture and subsequent rinsing with pure water at least twice.

The present invention also provides an washing apparatus comprising a cleaning chamber, a substrate holder in the cleaning chamber, means for rotating the substrate holder, a first nozzle for supplying a first liquid medicament to the substrate, and a second nozzle for supplying a second liquid medicament to the substrate, wherein the second nozzle is arranged so that the second liquid medicament is mixed with the first liquid medicament from the first nozzle before the liquid medicaments reach the substrate.

Since a solution system which evolves heat on mixing is utilized with the present method, the reaction of decomposing and removing the foreign matter or the resist pattern present on the substrate may be promoted without providing heating means, such as an electric heater, on the washing apparatus. The liquid temperature of the liquid washing mixture is rapidly increased since the time instant of initiation of mixing of the liquid medicaments, and is monotonously lowered after a constant temperature is reached. For this reason, it becomes necessary to control the timing of mixing of the various medicaments.

The liquid temperature at the time when the liquid washing mixture is spread on the substrate surface depends on various parameters, such as (a) the flow ratios of the various liquid medicaments, (b) the distance of the mixing point of the medicaments as far as the substrate surface or (c) the rotational speed of the substrate. The flow ratio (a) being one of the parameters may be understood from the fact that the mixing heat is a value which depends on the molar fraction. The distance (b) is determined by the degree of heating or cooling the liquid washing mixture undergoes before reaching the substrate surface. The rotational speed (c) determines the residence time duration of the liquid washing mixture on the substrate, that is the time which elapses since the time of arrival of the liquid washing mixture on the substrate surface until expulsion from the surface under the centrifugal force.

It is noted that rinsing with pure water is usually carried out after washing with the washing solution. According to the present invention, the washing cycle consisting of washing with the liquid washing mixture followed by rinsing with pure water is repeated a number of times for improving the washing efficiency. It is because the portion of the resist material which has been decomposed or exfoliated to a certain extent may be flushed off with pure water without using the liquid medicaments. This diminishes the amount of consumption of the liquid washing mixture and occasionally the total time required for washing.

The present invention is applicable in particular to the decomposition and removal of resist materials by the $H_2SO_4$—$H_2O_2$ liquid mixture. The concentrated sulfuric acid and aqueous hydrogen peroxide evolve heat on mixing so that the temperature on the order of 100° C. is reached. By employing the liquid washing liquid, not only the hardly soluble resist materials, such as the CMS resist material, but also the common novolak resist material, or even organic contaminants remaining on the substrate, may be quickly removed on decomposition.

DETAILED DESCRIPTION OF THE PREFERRED EMBODIMENTS

Figure 1:
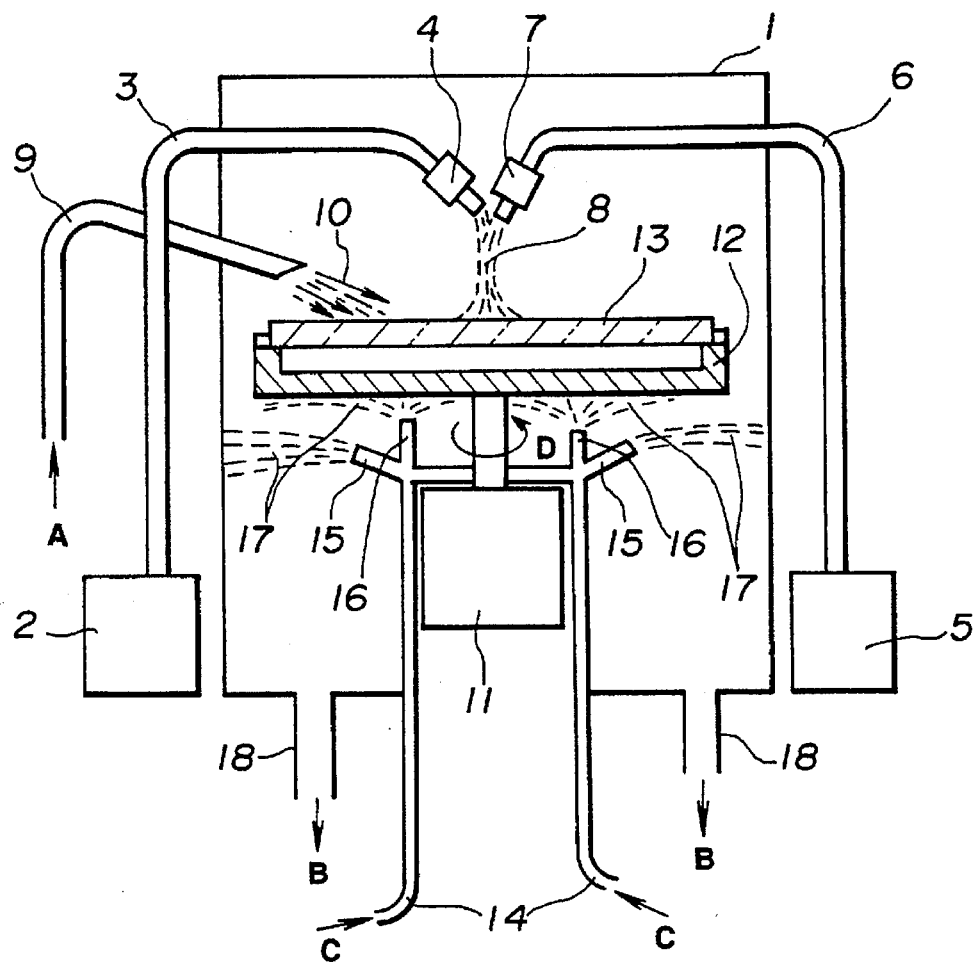
FIG. 1 is a schematic cross-sectional view showing a washing device according to the present invention.

The washing device employed in the inventive method is explained. The washing device includes a cleaning chamber 1 for containing a photomask substrate 13 as an object of washing, as shown in FIG. 1. A substrate holder 12 for holding the photomask substrate 13 as the object of washing is arranged within the cleaning chamber 1. The substrate holder 12 is run in rotation by a driving motor 11 of a driving and driving means, with the photomask 13 resting thereon.

The cleaning chamber 1 includes a first nozzle 7 for ejecting concentrated sulfuric acid ($H_2SO_4$), as a first pharmaceutical solution (liquid medicament) stored in a storage tank 5, onto the photomask 13 held on the substrate holder 12, and a second nozzle 4 for ejecting aqueous hydrogen peroxide ($H_2O_2$), as a second pharmaceutical solution (liquid medicament) stored in a second storage tank 2, onto the photomask 13. The first nozzle 7 and a storage tank 5 for $H_2SO_4$ are interconnected by a conduit 6, while the second nozzle 4 and a storage tank 2 for $H_2O_2$ mounted outside of the cleaning chamber 1 are interconnected by a conduit 3. These conduits 6 and 3 are formed of a fluorine resin.

Meanwhile, concentrated sulfuric acid ($H_2SO_4$) supplied from the storage tank 5 and aqueous hydrogen peroxide ($H_2O_2$) supplied from the storage tank 2 are pressurized and supplied to the conduits 3 and 6 so as to be ejected via the nozzles 7 and 4, respectively.

Figure 2:
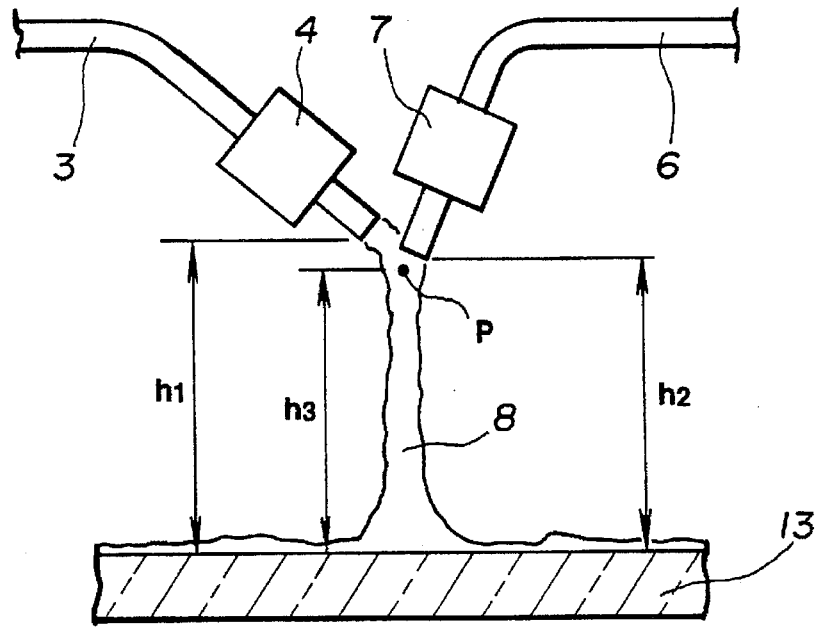
FIG. 2 is an enlarged front view showing the vicinity of a nozzle of the washing device according to the present invention.

In order for concentrated sulfuric acid ($H_2SO_4$) and aqueous hydrogen peroxide ($H_2O_2$) ejected via these nozzles 7 and 4 to be ejected in the mixed state onto substantially the mid point on the photomask substrate 13, the first and second nozzles 7 and 4 are arranged on top of the mid part of the photomask substrate 13, with the opening ends thereof drawn close to each other and directed towards the photomask substrate 13, as shown in FIG. 2. Thus the concentrated sulfuric acid ($H_2SO_4$) and aqueous hydrogen peroxide ($H_2O_2$) ejected via these nozzles 7 and 4 are mixed together at a position above the photomask substrate 13, with a mixing point being a point of intersection of the lines of extension of the nozzles 7 and 4. The concentrated sulfuric acid ($H_2SO_4$) and aqueous hydrogen peroxide ($H_2O_2$) are mixed together at the mixing point P and ejected onto the surface of the photomask substrate 13 in the form of the $H_2SO_4$—$H_2O_2$ liquid mixture 8.

Meanwhile, the washing device of the present invention is adapted for washing the photomask substrate 13 by utilizing the heat generated by the mixing of $H_2SO_4$ and $H_2O_2$. However, for realizing efficient heat generation, it is possible to heat concentrated sulfuric acid ($H_2SO_4$) and aqueous hydrogen peroxide ($H_2O_2$) stored in the storage tank 5 for concentrated sulfuric acid ($H_2SO_4$) and in the storage tank 2 for aqueous hydrogen peroxide ($H_2O_2$) preliminarily by heating means annexed to these storage tanks 5 and 2.

A surface rinse conduit 9 is provide in the cleaning chamber 1 for supplying pure water for rinsing the surface of the photomask substrate 13 held by the substrate holder 12. The surface rinse conduit 9 is provided in the cleaning chamber 1 with its opening end directed above the outer periphery of the photomask substrate 13, as shown in FIG. 1. Pure water 10 supplied via the surface rinse conduit 9 from the direction shown by arrow A in FIG. 1 is ejected via the opening end of the surface rinse conduit 9 so as to be sprayed onto the surface of the photomask substrate 13 from an obliquely upper direction. The pure water 10 is used not only for surface rinsing but also for adjusting the liquid temperature by being sprayed during supply of the $H_2SO_4$—$H_2O_2$ liquid mixture.

A back surface rinse conduit 14 is mounted within the cleaning chamber 1 on the back side of the photomask substrate 13 held by the substrate holder 12. The distal end of the back surface rinse conduit 14 is branched into a chamber rinsing nozzle 15 having an opening opened towards the sidewall surface of the cleaning chamber 1 and a back surface rinse nozzle 16 having an opening opened towards the back surface of the photomask substrate 13. Pure water 17 transported through the back surface rinse conduit 14 in the direction shown by arrow C in FIG. 1 is ejected by these rinse nozzles 15 and 16 in the directions as shown in FIG. 1. The pure water 17 ejected from the back surface rinse nozzle 16 is used for removing the $H_2SO_4$—$H_2O_2$ liquid mixture guided along the back surface of the photomask substrate 13, while being used for cooling the photomask substrate 13 or adjusting pH values of the waste liquid. The pure water 17 ejected via the rinse nozzle 15 contributes to rinsing of the inner wall surface of the cleaning chamber 1 and to pH adjustment of the waste liquid.

Meanwhile, the substrate holder 12, holding the photomask 13, is run in rotation by a driving motor 11 in the direction shown by arrow D in FIG. 1, so that the $H_2SO_4$—$H_2O_2$ liquid mixture 8, ejected on the photomask substrate 13, pure water 10 and pure water 17 are spread out uniformly on the front surface and the back surface of the photomask substrate 13.

Meanwhile, the waste liquid produced in the cleaning chamber 1 is discharged in its entirety in the direction indicated by arrow B in FIG. 1 via a drain port 18 having an opening in the bottom surface of the cleaning chamber 1.

An illustrative washing method for washing the photomask 13 using the above-described washing device is explained.

EXAMPLE 1

In the present Example, the relation between the $H_2SO_4$/$H_2O_2$ flow ratio and the temperature distribution of the $H_2SO_4$—$H_2O_2$ liquid mixture was investigated by way of a preliminary experiment of exfoliating the CMS based resist pattern from the photomask substrate using the above-described washing device.

The photomask substrate 13 is a glass substrate, 127 mm by 127 mm in size, having a Cr light-interrupting film deposited thereon to form a mask blank on which an electron resist material, manufactured by TOSO CO. LTD. under the trade name of CMS-EX(S), in order to form a resist film having a film thickness of 0.4 µm. The resist film is difficult to exfoliate even with the use of sulfuric acid, such that exfoliation by plasma ashing is usually recommended.

With the above-described washing device, the height $h_1$ of the second nozzle 4 for supplying $H_2O_2$, the height $h_2$ of the first nozzle 7 for supplying $H_2SO_4$ and the height $h_3$ of the mixing point P, from the surface of the photomask 13 as a reference, are set to 46.5 mm, 43.5 mm and 43.0 mm, respectively.

With the photomask substrate 13 remaining stationary, the $H_2SO_4$—$H_2O_2$ liquid mixture 8 was supplied to its surface at various $H_2SO_4$—$H_2O_2$ flow ratios and the temperatures of the liquid mixture 8 were measured at three measurement points arrayed on a diagonal line, that is, a center point (point 1), a corner (point 2) and an intermediate point between the points 1 and 3 (point 2), using a thermistor.

Figure 3:
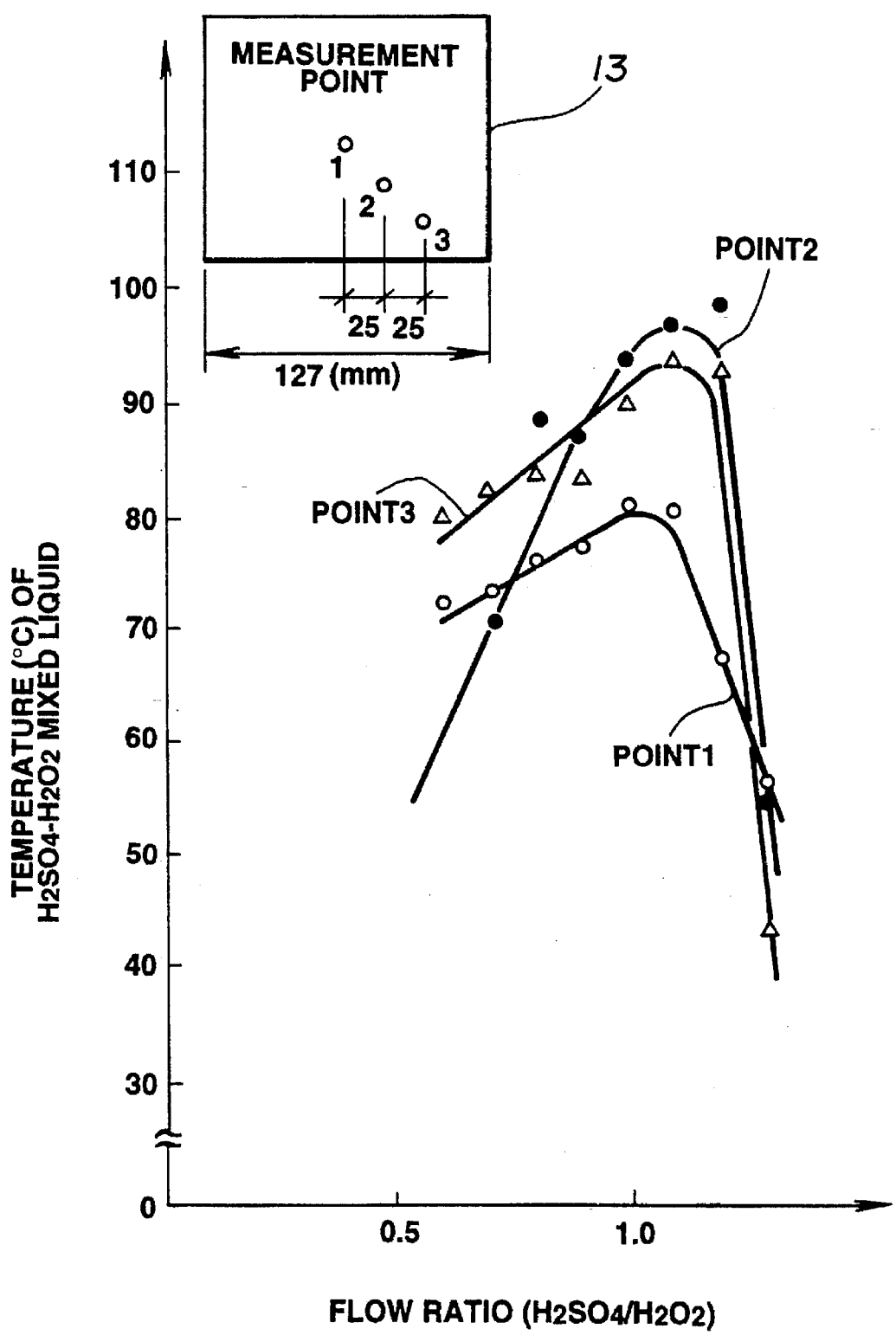
FIG. 3 is a graph showing the relation between the $H_2SO_4/H_2O_2$ flow ratio for the optimized nozzle height and the temperatures of the $H_2SO_4$—$H_2O_2$ liquid mixture as plotted at various measurement points on the photomask substrate.

The results are shown in FIG. 3, wherein the abscissa stands for the $H_2SO_4$—$H_2O_2$ flow ratio, the ordinate stands for the temperature of the $H_2SO_4$—$H_2O_2$ liquid mixture in (° C.), plots of white circles (O) indicate the result of measurement at the points 1, plots of black circles (●) indicate those at the points 2 and plots of white triangles (Δ) indicate those at the points 3. It is thus seen that, with the flow ratio ranging between 0.9 to 1.1, the temperatures at the points 2 and 3 are substantially 85° to 95° C. and approximately equal to each other, while the temperature at the point 1 directly below the mixing point P is approximately 80° C. Referring to FIG. 3, the variation in temperature of the $H_2SO_4/H_2O_2$ mixture along three different points of the substrate as illustrated. The temperature at point 1 on the substrate surface, disposed immediately below the mixing point P (see FIG. 2), is lower than the temperatures at points 2 and 3, which are disposed toward the outer periphery of the surface. This difference in temperature is due to the heat generated by the mixing of the sulfuric acid and hydrogen peroxide. That is, the temperature is higher at points 2 and 3 than at point 1 because the sulfuric acid and hydrogen peroxide have been more thoroughly mixed at points 2 and 3 than at point 1 and the resulting heat of mixing has caused the temperature of the liquid mixture to increase as it has traveled from point 1 to points 2 and 3. Similarly, the temperature at point 1 will be higher than the temperature at point P (see FIG. 2) disposed immediately above point 1 because the sulfuric acid and hydrogen peroxide are more thoroughly mixed at point 1 than they are at point P disposed above point 1. Therefore, the temperature of the liquid washing mixture consisting of sulfuric acid and hydrogen peroxide at point P will be at a first and lower temperature at point P than the more thoroughly mixed liquid washing mixture at a point on or slightly above the substrate surface due to the increased mixing and released heat of mixing as the liquid mixture travels from point P toward the substrate surface. Therefore, at or before the time the mixture reaches the substrate surface, the liquid has risen in temperature to a higher second temperature from the lower first temperature at point P.

EXAMPLE 2

In the present Example, a similar experiment was conducted with the heights of the nozzles lowered 5 mm from the nozzle positions used in Example 1. That is, the height $h_1$ of the second nozzle 4 for supplying $H_2O_2$, the height $h_2$ of the first nozzle 7 for supplying $H_2SO_4$ and the height of the mixing point P were set to 41.5 mm, 38.5 mm and 38.0 mm, respectively (FIG. 2).

Figure 4:
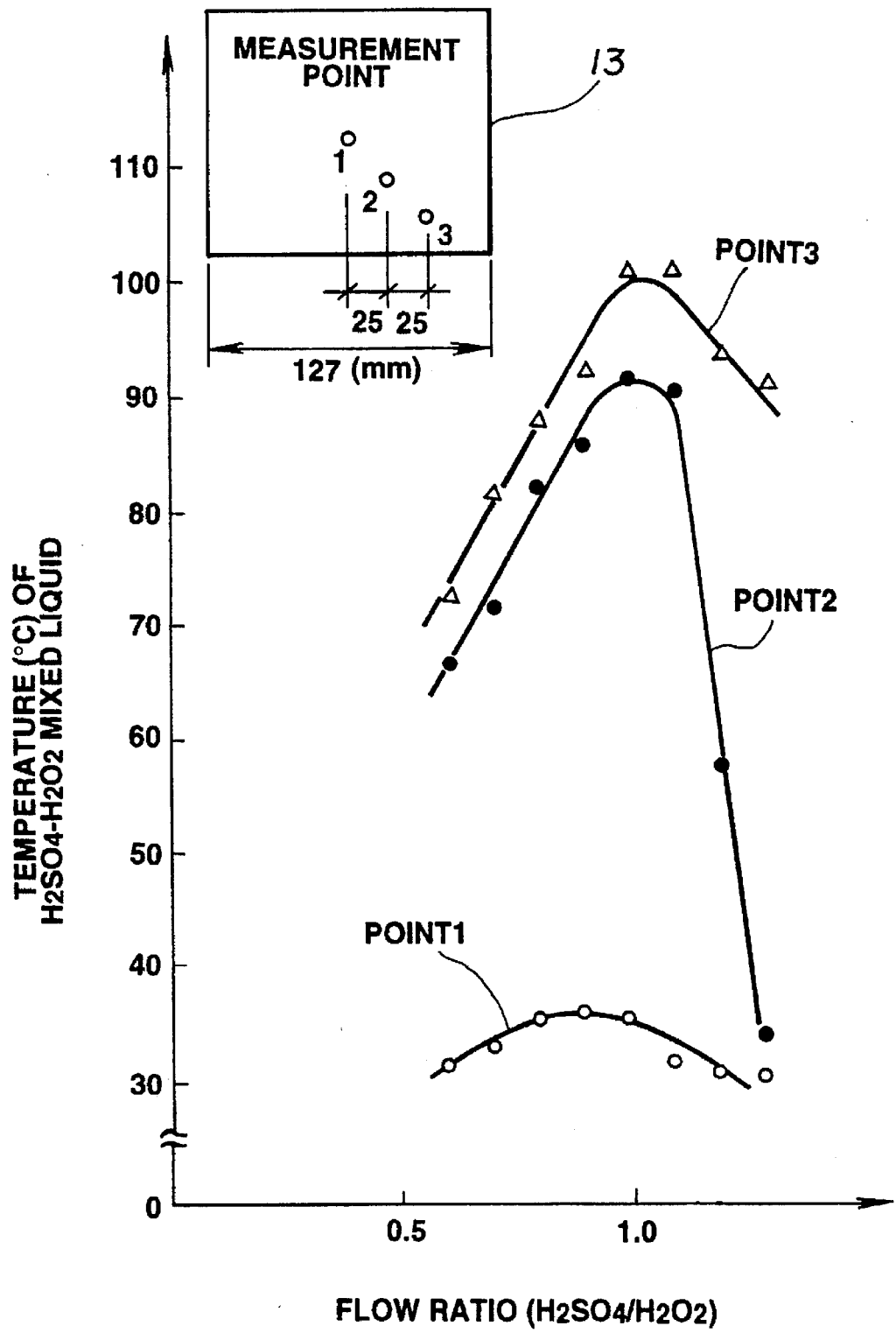
FIG. 4 is a graph showing the relation between the flow ratio for the nozzle height lower than its optimum height and the temperatures of the $H_2SO_4$—$H_2O_2$ liquid mixture as plotted at various measurement points on the photomask substrate.

The results are shown in FIG. 4. It is seen that, for any of the flow ratios employed, the temperature of the $H_2SO_4$—$H_2O_2$ liquid mixture was lowest at the point 1 directly below the nozzle, while becoming higher towards the outer periphery of the photomask substrate 13. This indicates that $H_2SO_4$ and $H_2O_2$ cannot be mixed together sufficiently during descent and can be mixed satisfactorily after being contacted with the substrate surface.

Meanwhile, with the above setting of the nozzle heights, when the $H_2SO_4$—$H_2O_2$ liquid mixture was flushed for five minutes with the mixing ratio of 1:1, the resist film in the vicinity of the point 1 was left without being removed.

It is seen from these results that there is an optimum value for each nozzle height and that Example 1 is more desirable than Example 2.

COMPARATIVE EXAMPLE

In the present Comparative Example, a similar experiment was conducted, using a nozzle of the type in which $H_2SO_4$ and $H_2O_2$ were mixed directly before ejection.

Figure 6:
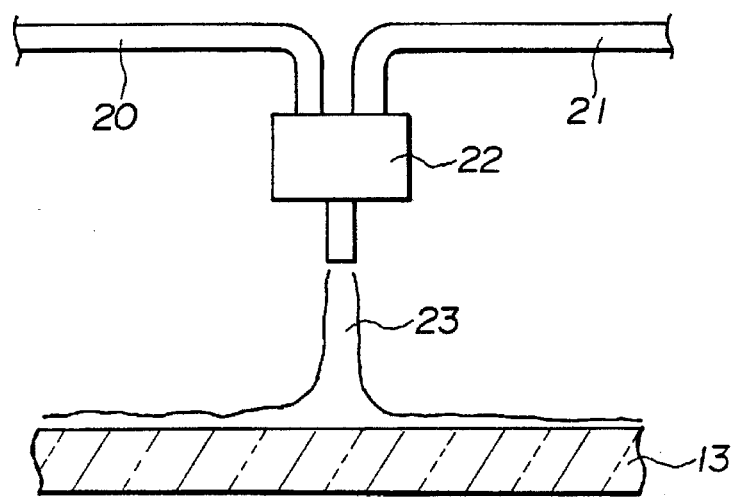
FIG. 6 is a schematic cross-sectional view showing, for comparison sake, a nozzle of the type in which $H_2SO_4$—$H_2O_2$ are previously mixed in the inside thereof and subsequently discharged.

The nozzle is shown in FIG. 6. That is, a conduit 20 of fluorine resin for transporting $H_2SO_4$ under pressure and conduit 21 of fluorine resin for transporting $H_2O_2$ under pressure are connected to a common nozzle 22 in which $H_2SO_4$—$H_2O_2$ are mixed together so as to be ejected as a $H_2SO_4$—$H_2O_2$ liquid mixture 23. The height of the nozzle was set to 43.0 mm which is equal to the height $h_3$ of the mixing point P in Example 1.

Figure 7:
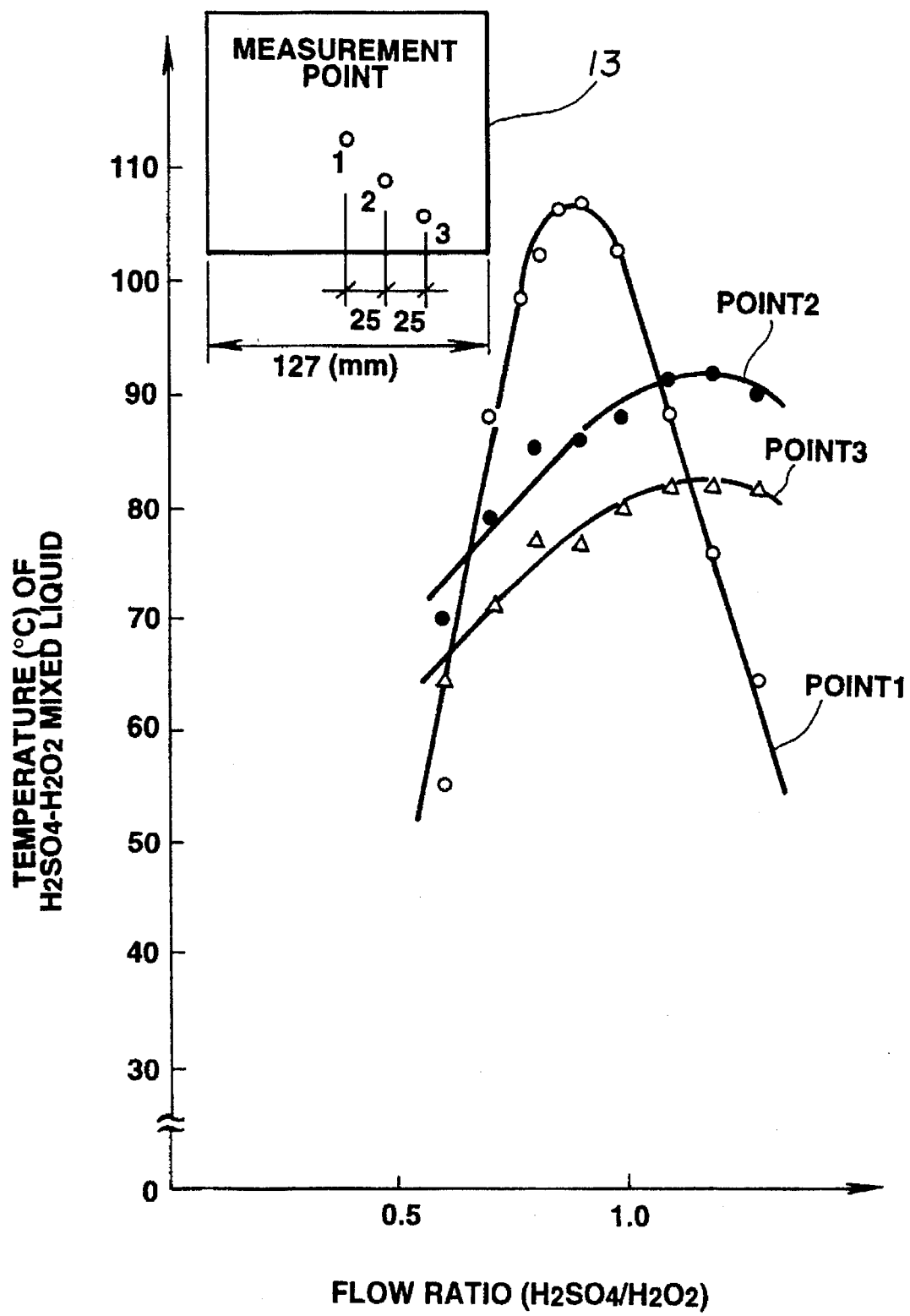
FIG. 7 is a graph showing the relation between the flow ratio with the use of the nozzle shown in FIG. 6 and the temperatures of the $H_2SO_4$—$H_2O_2$ liquid mixture, as plotted at various measurement points on the photomask substrate.

FIG. 7 shows the results of temperature measurement of the $H_2SO_4$—$H_2O_2$ liquid mixture at the various points on the photomask substrate 13. It is thus seen that, for the flow ratio ranging between about 0.7 and 1.0, the liquid temperature is maximum at the point 1 directly below the nozzle, and is decreased in the order of the temperatures at the center, at the point 2 and at the point 3, with the temperature distribution being extended over a broader range. This indicates that the temperature increase substantially comes to an end within the inside of the nozzle 22 or during descent, with the temperature then being decreased monotonously.

EXAMPLE 4

Since it has now been shown from the Examples and the Comparative Example with the stationary photomask substrate that the use of separate nozzles and control of the nozzle heights are effective, an experiment was conducted in the present Example of exfoliating the resist pattern on the rotating photomask substrate on the basis of a combined cycle of exfoliation by the $H_2SO_4$—$H_2O_2$ liquid mixture and surface rinsing with pure water.

The size of the photomask 13 employed in the experiment and the type of the electron resist material were the same as those of Example 1. However, in the present Examples the resist pattern was formed through exposure to an electron beam based on a test pattern, development, post-baking and descumming, and a Cr photointerruptive film was etched using the resist pattern as a mask.

The nozzle height setting was the same as that in Example 1.

The $H_2SO_4$—$H_2O_2$ flow ratio was set to 450 ml/min for both components, that is, the mixing ratio was set to 1:1.

In the present Example, resist exfoliation was achieved by one cycle. The number of revolutions of the photomask 13 and the processing time duration were set for the different steps to the following illustrative values:

| exfoliation | 1 (rpm),   | five minutes |
|-------------|------------|--------------|
| rinsing     | 100 (rpm), | one minute   |
| drying      | 900 (rpm), | 40 seconds   |

After these steps were terminated in their entirety, the surface of the photomask 13 was observed by a microscope. It was found that the resist pattern was exfoliated completely. Consequently, it was confirmed by the present invention that wet exfoliation of the CMS based resist material may become a practical process.

Meanwhile, if the exfoliating time was reduced to be shorter than five minutes, the tendency for the resist pattern to be left was noticed.

EXAMPLE 5

In the present Example, resist exfoliation was achieved in two cycles.

Figure 5:
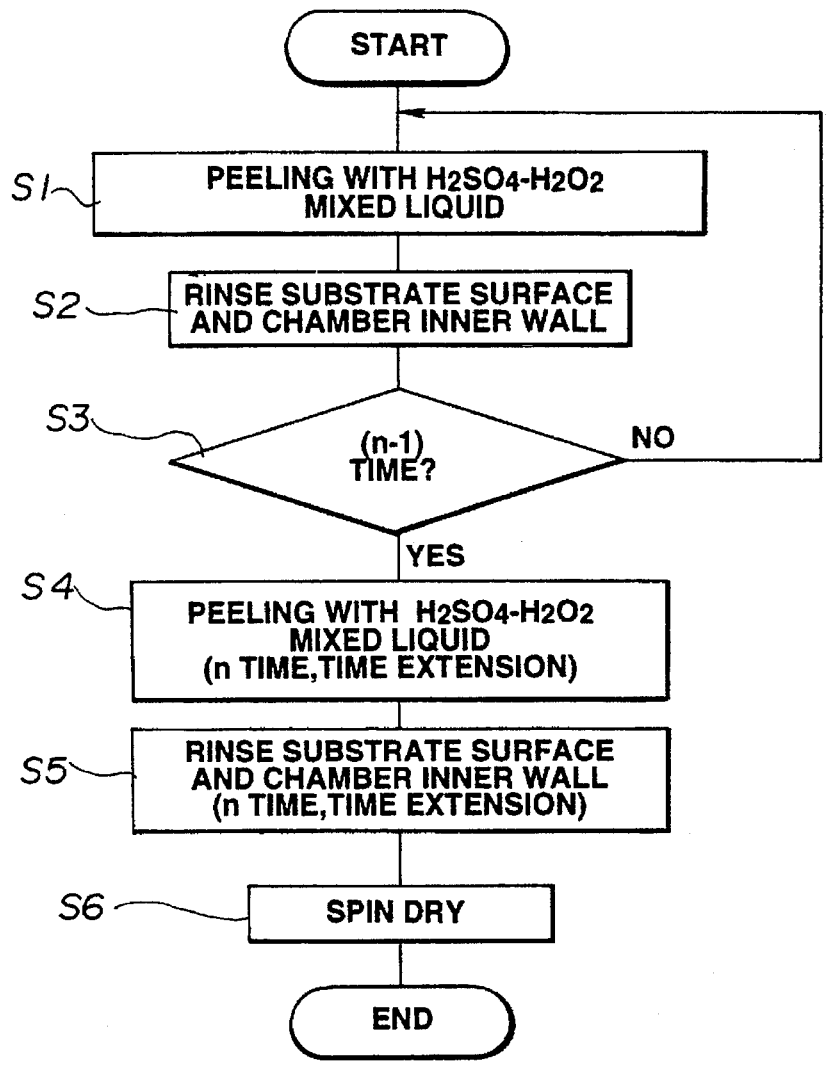
FIG. 5 is a flow chart showing a sequence in which a cycle consisting of exfoliation with the $H_2SO_4$—$H_2O_2$ liquid mixture and rinsing with pure water is repeated.

FIG. 5 shows a flow chart for the cycle of resist exfoliation. The sequence is based on repetition by n times of a cycle consisting of exfoliation by the $H_2SO_4$—$H_2O_2$ liquid mixture and surface rinse with pure water, where n is a natural number of not less than 2. However, since the last nth cycle may be occasionally carried out for a time longer than a normal time duration, the nth cycle is indicated independently in the present chart. Meanwhile, since the rinsing of the cleaning chamber is carried out simultaneously during the surface rinsing, that effect is indicated in the flow chart.

That is, the cycle consisting of exfoliation by the $H_2SO_4$—$H_2O_2$ liquid mixture by the step S1 and the surface rinsing by the step S2 is carried out repeatedly and, if the cycle is found by the step S3 to have been repeated (n−1) times, control proceeds to steps S4 and S5 to carry out the nth exfoliation and the nth surface rinsing, respectively. Spin drying is carried out at a step S6 to complete resist exfoliation. In the present Example, n is set to 2 (n=2).

The number of revolutions of the photomask 13 and the processing time duration were set for the different steps to the following illustrative values:

| exfoliation (first and second cycles) | 1 (rpm),   | five minutes |
|---------------------------------------|------------|--------------|
| rinsing (first cycle)                 | 100 (rpm), | 20 seconds   |
| rinsing (second cycle)                | 200 (rpm), | one minute   |
| drying                                | 900 (rpm), | 40 seconds   |

The number of revolutions of the photomask 13 during exfoliation was set to a lower speed, for the reason that, if the photomask substrate 13 is rotated at a high speed, there is a risk that the $H_2SO_4$—$H_2O_2$ liquid mixture be discharged by the centrifugal force while as yet the temperature of the $H_2SO_4$—$H_2O_2$ liquid mixture is not raised sufficiently.

In the present Example, the exfoliating step was performed in two steps, for each of which the rinsing was carried out for a shorter time for reducing the time necessary for exfoliation by one minute as compared to that in Example 4. That is, the time for exfoliation could be reduced to four minutes. Since the flow rate of the $H_2SO_4$—$H_2O_2$ liquid mixture is kept constant, reduction on the exfoliating time means the saving in the consumption of the liquid mixture.

EXAMPLE 6

In the present Example, resist exfoliation was carried out in three cycles, that is n=3. The sequence of the resist exfoliation was similar to that of Example 5.

The number of revolutions of the photomask 13 and the processing time duration were set for the different steps to the following illustrative values:

| exfoliation | | |
|---|---|---|
| (first and second cycles) | 1 (rpm), | 70 seconds |
| (third cycle) | 1 (rpm), | 75 seconds |
| rinsing | | |
| (first and second cycle) | 100 (rpm), | 10 seconds |
| (third cycle) | 200 rpm, | one minute |
| drying | 900 (rpm), | 40 seconds |

In the present Example, the exfoliation step was divided into three sub-steps and rinsing for a short tome duration was carried out between the sub-steps, thereby reducing the time required for exfoliation to 3 minutes and 25 seconds which is reduction by 25 seconds from the exfoliation time for the Example 5. The total time necessary for exfoliation, rinsing and drying could also be reduced.

Although the present invention has been described with reference to six Examples, the present invention is not limited to these merely illustrative Examples.

As the resist material, the CMS resist material, which it is presently most difficult to exfoliate by the wet exfoliation technique, has been used in the above explanation. As a matter of course, common photoresist materials, which it is easier to exfoliate than the CMS resist material, can be exfoliated more easily.

The present invention may be applied not only for resist exfoliation, but also for rising off metal impurities or organic contaminants. The organic contaminants, above all, can be removed by the above-mentioned the $H_2SO_4$—$H_2O_2$ liquid mixture.

The substrates to be washed include common semiconductor wafers or compound semiconductor wafers, in addition to the photomask substrates mentioned above.

For achieving a more uniform temperature of the mixed rinse liquid on the substrate, it is effective to discharge the rinse solution towards a point slightly offset from the center of the rotating substrate, or to heat the liquid medicaments within the tanks.

Also, it is to be noted that the conditions for exfoliation, rinsing or drying or the detailed structure of the rinsing device employed for executing the present invention may be suitably modified in any desired manner.

It will be appreciated form the foregoing that, since spin washing is carried out using the mixing heat of the liquid medicaments in accordance with the method and apparatus of the present invention, the washing effects may be improved for improving the throughput, while re-deposition is produced only on extremely rare occasions. Since there is no necessity of providing heating means in the washing device or combining the washing device with other mechanical washing or optical washing means, the apparatus is inexpensive and the process simplified. If, above all, the $H_2SO_4$—$H_2O_2$ liquid mixture is employed as the washing liquid, the resist material which is hardly soluble and which has hitherto been removed for the most part by $O_2$ plasma ashing, can now be exfoliated by the wet process, thereby widening the latitude in process selection.

What is claimed is:

1. A method for washing a substrate selected from photomask substrates and semi-conductor substrates comprising the following steps:

mixing concentrated sulfuric acid and hydrogen peroxide by discharging concentrated sulfuric acid and hydrogen peroxide from separate supply ports to form a single stream of a liquid washing mixture directed toward the substrate at a mixing point P disposed a distance from the substrate, the liquid washing mixture having a first lower temperature at point P, the liquid washing mixture being directed toward the substrate;

permitting mixing heat generated by said mixing of concentrated sulfuric acid and hydrogen peroxide to increase the temperature of the liquid washing mixture to a second higher washing temperature as the mixture transits toward substrate;

contacting the substrate with the liquid washing mixture at the second higher washing temperature.

2. The method as claimed in claim 1, wherein the substrate is rotated during washing.

3. The method as claimed in claim 1 wherein a washing cycle consisting of washing with said liquid washing mixture and subsequent rinsing with pure water is repeated at least twice.

4. A method as claimed in claim 1, wherein said second higher washing temperature is between about 85° C. to about 100° C.

5. A method as claimed in claim 1, wherein the distance is from about 38.0 mm to about 43.0 mm from a surface of the substrate.

* * * * *